United States Patent

Kitajima et al.

[11] Patent Number: 5,838,058
[45] Date of Patent: Nov. 17, 1998

[54] SEMICONDUCTOR SUBSTRATE AND SEMICONDUCTOR DEVICE EMPLOYING THE SAME

[75] Inventors: Hiroshi Kitajima; Akiyoshi Kobayashi, both of Tokyo, Japan

[73] Assignee: NEC Corp., Japan

[21] Appl. No.: 767,039

[22] Filed: Dec. 11, 1996

Related U.S. Application Data

[63] Continuation of Ser. No. 358,325, Dec. 19, 1994, abandoned.

[30] Foreign Application Priority Data

Dec. 20, 1993 [JP] Japan .................................. 5-344941

[51] Int. Cl.$^6$ ................................................. H01L 29/93
[52] U.S. Cl. ............................................ 257/628; 257/607
[58] Field of Search ................................ 257/628, 627, 257/611, 607

[56] References Cited

FOREIGN PATENT DOCUMENTS

4-343479  11/1992  Japan .

Primary Examiner—Donald Monin

[57] ABSTRACT

In the vicinity of the (100) plane, planar channeling by (100) type crystal planes, which are ($0\bar{1}1$) plane and (011) plane according to the (100) surface plane, degrades uniformity of ion implantation. Therefore, a major surface of the substrate is established at a plane perpendicular to a crystal orientation forming an angle greater than or equal to 3.5° with two planes perpendicularly intersecting the (100) plane. Namely, in consideration of fluctuation in setting to an ion implantation device and ion implantation angle, the substrate having surface orientation within a range 104 is employed. Also, by limiting the orientation to be less than or equal to 10° from the (100) plane, ion implantation can be performed perpendicularly to the substrate without modifying the process condition. The result of the foregoing is a semiconductor substrate which will never cause planar channeling even when ion implantation is performed in a perpendicular direction to the surface of a semiconductor substrate of silicon.

8 Claims, 11 Drawing Sheets

SEMICONDUCTOR SUBSTRATE AND SEMICONDUCTOR DEVICE EMPLOYING THE SAME

CROSS REFERENCE OF THE RELATED APPLICATION

This is a continuation of application Ser. No. 08/358,325, filed on Dec. 19, 1994 now abandoned.

BACKGROUND OF THE INVENTION

1. Field of the Invention

The present invention relates generally to a semiconductor substrate and a semiconductor device, and more particularly to a semiconductor substrate made of silicon and a semiconductor device fabricated by employing said semiconductor substrate.

2. Description of the Related Art

Ion implantation technology is an inherent technology for fabrication of current semiconductor devices. Especially, in fabrication of a semiconductor device of silicon, it is extremely important to control impurity concentration, profile and uniformity. One of the factors degrading controllability of ion implantation is channeling. Channeling can be classified as axial channeling caused a low order crystal axis, such as <100> direction, and planar channeling caused on a low order crystal plane, such the (100) plane or (111) plane, for the purpose of illustration.

Example will be given for the case where ion implantation is performed perpendicularly to a (100) substrate, planar channeling on a (0$\bar{1}$1) plane and (011) plane perpendicularly intersecting with the (100) plane is majority. Also, planar channeling on a (010) plane or (001) plane may also be affected. Combinations of those planar channeling may cause axial channeling. In the case of the semiconductor substrate of silicon, in which an element is formed by application of ion implantation technology, it becomes necessary to avoid such channeling.

One of conventional technologies to be employed for avoiding channeling is to perform ion implantation in an oblique direction instead of the perpendicular direction with respect to the substrate. For instance, when ion implantation is to be performed on a semiconductor substrate having a major surface in a crystal orientation of the (100) plane, it has been known to incline the ion implanting direction to a magnitude of approximately 7° with respect to the perpendicular direction to the substrate. Therefore, in the process which is not required strict implantation region control, such method has been taken.

However, in the modern semiconductor devices, associating with high package density of the elements, processes requiring strict ion implantation region control are increasing. In such case, it becomes necessary to perform ion implantation in substantially perpendicular direction with making the semiconductor substrate with a patterned photoresist. Therefore, it is also known in the prior art to employ a semiconductor device having the major plane inclined at about 3° to 7° as disclosed in Japanese Unexamined Patent Publication (Kokai) No. (Heisei) 4-493436.

By this, for fabricating the element with the semiconductor substrate, it becomes possible to perform ion implantation in the vertical direction with respect to the semiconductor device without causing channeling. Also, as a semiconductor device having face orientation near the (100) plane, the substrates having 4° inclined surface orientation in the direction toward <001> plane have been available in the market. In this case, the ion implantation in perpendicular direction can also be performed.

Figure 1A:
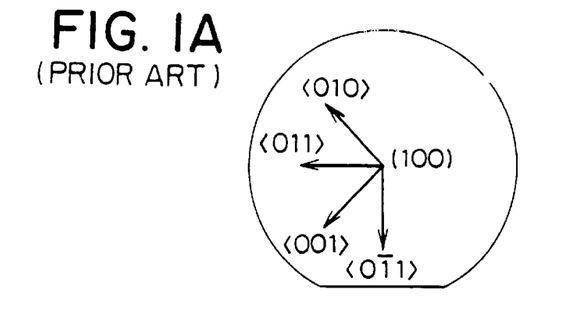
FIGS. 1A to 1E as set forth above are illustration showing atomic arrangements of crystal orientation in the vicinity of (100) plane.
Figure 1B:
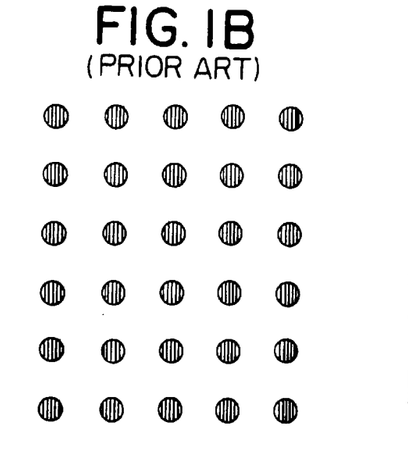
Figure 1C:
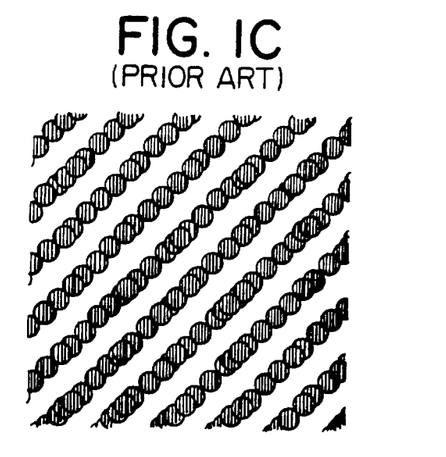
Figure 1D:
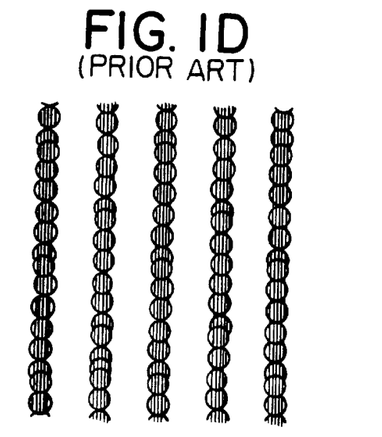
Figure 1E:
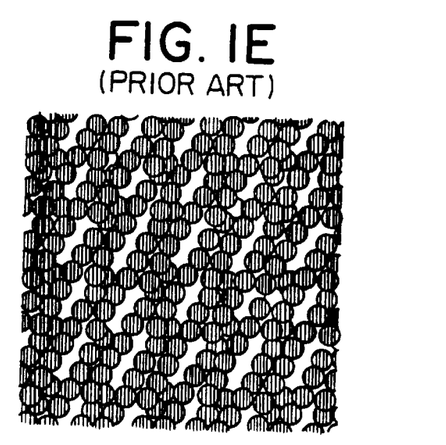

FIGS. 1A to 1E show an atomic arrangement of silicon of the crystal orientation in the vicinity of the (100) surface. The orientation in the semiconductor is set an orientation flat (OF) direction as <011> direction, as shown in FIG. 1A. FIG. 1B shows the atomic arrangement of silicon at the (100) surface, FIG. 1C shows the atomic arrangement of silicon on the plane inclined 7° from the <001> direction, FIG. 1D is the atomic arrangement of silicon on the plane inclined 7° toward <0$\bar{1}$1>, and FIG. 1E shows atomic arrangement on the plane inclined 7° toward the direction forming an angle of 30° with the <0$\bar{1}$1> direction.

It can be appreciated from FIGS. 1A to 1E that, when the direction to incline is <0$\bar{1}$1> direction, the (011) plane can be looked over even when the inclination angle is 7°. Also, it can be seen from FIGS. 1A to 1E that, when the direction to incline is <001> direction, the (010) plane can be looked over even when the inclination angle is 7°. Accordingly, in order to restrict plane channeling by inclining the face orientation from the (100) plane, it is possible to be affected by the plane channeling unless the inclining direction and angle are specified.

In view of this, to make the conventional method disclosed in the foregoing Japanese Unexamined Patent Publication No. Heisei 4-343479 effective, there are several conditions to be satisfied. For instance, the condition can be seen in the case where heat treatment is performed after ion implantation at high temperature and for a long period, such as in the case of formation of well structure. By performing ion implantation against an inclined surface which is inclined at a certain angle from the (100) plane, the axial channeling in the <100> direction can be restricted. Remaining non-uniformity of implantation can be improved by heat treatment at high temperature for a long period to achieve uniformity in a level acceptable for practical use.

Channeling may also be restricted when a non-crystal layer, such as an oxide layer, is formed on the plane of the substrate. It is typical that a 100 to 300 Å oxide layer is formed on the surface of the substrate upon performing ion implantation in order to avoid metal contamination. In the conventional process where ion implantation is performed with relatively low energy in the extent of 100 to 200 keV in the condition where the oxide layer is formed on the surface of the substrate, the prior art disclosed in the above-identified publication may be effective.

On the other hand, even when a semiconductor substrate having the surface inclined for 4° toward the <011> direction is employed and ion implantation is performed in perpendicular direction to the semiconductor substrate, similar effect to the prior art disclosed in the above-identified publication may be attained. In such case, since the non-crystal layer, such as silicon oxide layer is present on the surface of the substrate upon performing ion implantation and heat treatment is performed at high temperature for a long period, relatively uniform impurity doped layer can be formed.

In the recent years, high energy ion implantation technology is frequently used for more precise control of the impurity profile in the silicon substrate and thus forming high performance elements. When high-energy ion implantation is to be performed, the thickness of a masking member (e.g. photoresist) can become 3 to 4 $\mu$m in order to achieve local ion implantation. If the ion implantation is performed with inclination of 7° from the perpendicular direction of the substrate, a region of about 0.5 $\mu$m from the edge of the masking member may be left free from ion implantation. Therefore, when a margin of the implanting region cannot be large enough, it becomes necessary to perform ion implantation in the direction perpendicular to the substrate in order to limit the region where the ion is not implanted.

However, when the prior art as disclosed in the foregoing publication is applied, the following problems are inherently arisen. Namely, when high energy ion implantation technology is utilized, there is a tendency that the peak of the impurity profile is located at a deep portion within the substrate, the temperature of the heat treatment is lower than that in the prior art so that the element may be formed without destroying the impurity profile upon ion implantation. As a result, non-uniformity in ion implantation directly results in non-uniformity of the element characteristics. In this case, the energy for ion implantation to be used is in a range of 300 keV to 3 MeV. However, it is not practical to form a thick oxide layer corresponding to increasing of the implantation energy for restricting channeling by the non-crystal layer.

Accordingly, in the case where high energy ion implantation technology is used, magnitude of non-uniformity may be variable depending upon the conditions of implantation, such as ion implantation device to be used, wafer diameter, ion implantation amount, ion implantation energy, heat treatment condition and so forth.

Discussing about influence of the implanted ion species and implantation energy, the angle range where channeling is arisen, is greater in the heavier implanted ion species and is greater at lower implantation energy. For instance, in the case where phosphorous is implanted at an implantation energy of 300 keV to 400 keV which is practical range of condition and has high tendency to be influenced by the channeling, channeling may influence in the significant range in the substrate conditions shown in the above-identified publication. While it should be variable depending upon the ion implantation device, even in the device, dispersion of the beam is relatively restricted, the incident angle of the ion for 8 inches of substrate should be considered to be in the order of ±1.0.

For example, in case of implantation of phosphorous at 400 keV, influence of channeling cannot be avoided unless the ion is implanted at an angle greater than or equal to 0.9° when channeling at the $(0\bar{1}1)$ plane or $(011)$ plane is to be restricted, to make implantation depth within the substrate non-uniform.

Accordingly, as an angle to be formed between the ion implantation direction and the $(0\bar{1}1)$ plane or $(011)$ plane is required to be approximately 3.5° (=1.6+1.0+0.9). While the required angle may become smaller by improvement of the ion implantation device, in view of on-going study for large diameter substrate of 12 to 14 inches, the required angle, i.e. 3.5° may not be changed significantly.

Discussing in connection with the crystal orientation shown in FIG. 1A, when a semiconductor substrate having a surface inclined in a range of 3° to 7° in a direction of <0$\bar{1}$1> direction ±30°, channeling cannot be restricted to make the non-uniformity of the implantation depth in the substrate becomes substantial. Considering the depth where the impurity concentration becomes peak, a portion having concentration peak at 20% deeper than the depth of the peak at the portion where no channeling is caused, was presented. When ion implantation is performed in the same implantation condition for the semiconductor substrate having inclined surface at an angle of 4° in the direction from the $(100)$ plane to <001> direction, the depth of the concentration peak becomes approximately 20% deeper than the depth at the portion where no channeling is caused.

On the other hand, when the semiconductor substrate having the surface at an angle of 4° inclined in the direction of <001>, if the implantation direction can be controlled completely, by inclining for 1° to 2° in an appropriate direction upon ion implantation, ion implantation can be performed without leaving any region to be placed in blind of the mask so as not to be implanted the region and without causing channeling. However, the semiconductor substrate available in the market is not completely controlled in off direction. In fact, in the market, there are substrates having off direction of <001> and off direction of <010> in mixture.

Figure 2:
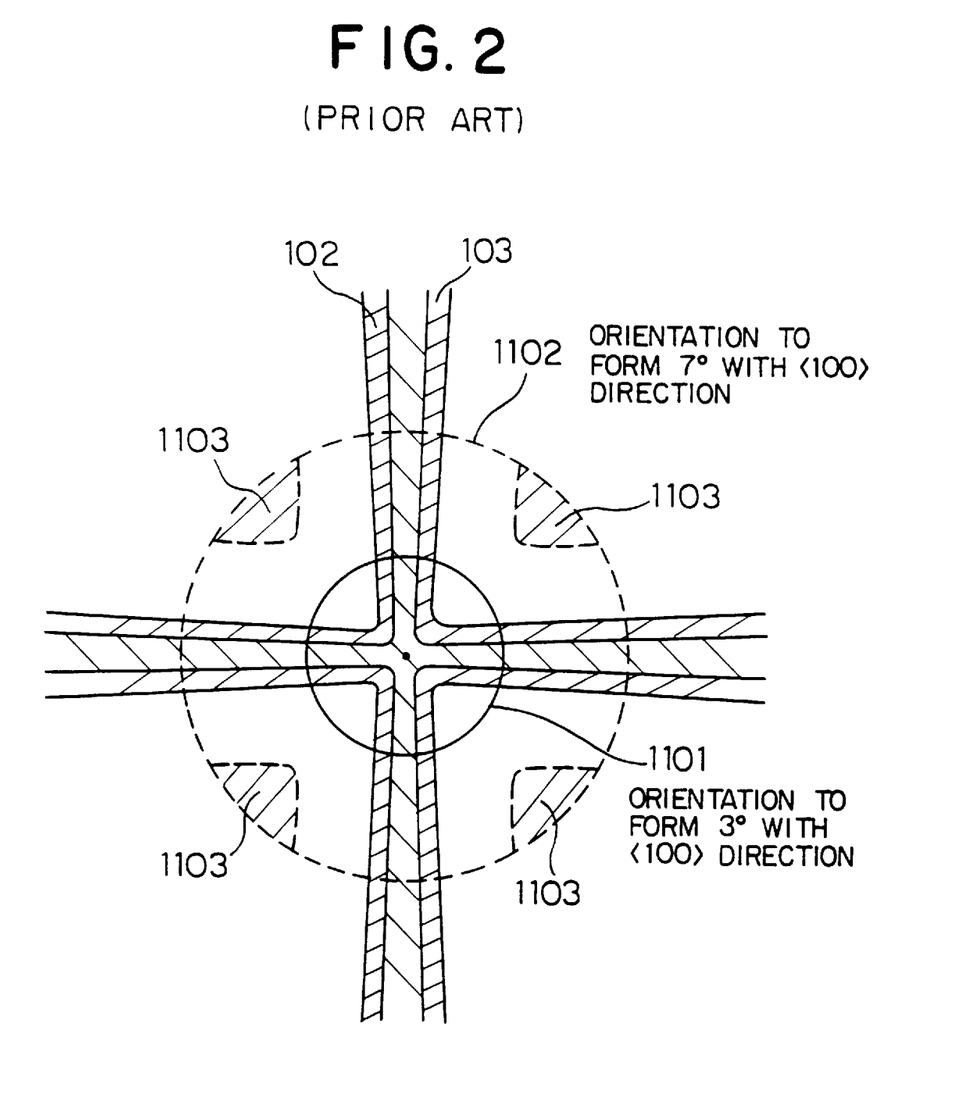
FIG. 2 is a plan view for explaining the surface orientation range of the semiconductor device which has been regarded as effective in the prior art.

FIG. 2 is a plan view showing one example of the surface orientation of the conventional semiconductor substrate disclosed in the above-identified publication. FIG. 2 shows the distribution of crystal orientation in the region close to the $(100)$ plane. The center point corresponds to <100> direction perpendicular to the $(100)$ plane, and the inclination angle is shown in the radial direction. A circle 1101 shown by the solid line represents a orientation forming an angle of 3° relative to the <100> direction, and the circle shown by broken line represents the orientation forming an angle of 7°.

When the surface orientation of the semiconductor substrate of silicon lies within the region 102 of FIG. 2, if phosphorous is implanted perpendicularly to the surface at 300 keV, channeling is completely caused. The region 103 adjacent the region 102 is the orientation range where channeling is caused slightly. The region 1103 is the region of the crystal orientation where the angle formed by both the $(010)$ plane and $(001)$ plane is larger than or equal to 3.5°. Namely, when the surface orientation of the semiconductor substrate of silicon falls within the region 1103, there should be no channeling portion in the semiconductor wafer. Therefore, in such case, the implantation depth within the substrate becomes non-uniform.

In the prior art, there are only semiconductor substrates that have the surface with the crystal orientation falling within the region 1103 or that can merely avoid channeling. Therefore, in the practical viewpoint, there are many regions where the channeling may be caused when used for high energy ion implantation.

As set forth above, for the conventionally known semiconductor substrate, if ion implantation is performed in the direction perpendicular or close to perpendicular to the semiconductor substrate for avoiding non-implanted region, the influence of channeling becomes unavoidable to cause non-uniformity of ion implantation. Since the semiconductor substrates, in which ion is implanted in non-uniformly, are used for fabrication of the semiconductor devices, the characteristics of the semiconductor device becomes non-uniform to cause lowering of yield.

SUMMARY OF THE INVENTION

It is an object of the present invention to provide a semiconductor substrate which may not cause surface channeling even when ion implantation is performed in perpendicular direction to the substrate and to provide a semiconductor device employing such semiconductor substrate.

A semiconductor substrate, according to the present invention, has a one major surface on a plane forming an angle less than or equal to 10° with <100> direction perpendicular to $(100)$ plane and forming angles greater than or equal to 3.5° with respective of $(0\bar{1}1)$ plane and $(011)$ plane perpendicular to the $(100)$ plane.

Also, a semiconductor device, according to the present invention, is fabricated by forming element applying ion implantation technology for performing ion implantation for a substrate surface in perpendicular direction with respect thereto, on the semiconductor substrate according to the present invention.

When high energy ion implantation is performed for the semiconductor substrate having a surface orientation near crystal orientation (100) plane, uniformity in ion implantation can be assured by restriction of surface channeling by the above-mentioned two planes perpendicular to the (100) plane. While the planar channeling on the crystal orientation (010) plane and so forth is concerned, little influence of channeling is detected. Therefore, there should be no problem in practical use.

When phosphorous or boron ion implantation is performed at high energy, higher than or equal to 300 keV, planar channeling due to (110) type planes, e.g. (011) plane and (0$\bar{1}$1) plane, is rarely caused when the angle formed between the (100) plane and the implantation direction is greater than or equal to 3.5°. Here, in strict sense, the angle formed by the (011) plane and the ion implantation direction is an angle between a projection of a vector in the ion implantation direction onto the (011) plane and the ion implantation direction.

In the semiconductor substrate having the surface orientation near the (100) plane, by employing a substrate having major plane oriented at crystal orientation, at which surface channeling can be restricted by the above-mentioned two planes perpendicular to the (100) plane, uniform ion implanted layer can be obtained. The condition for form the angle greater than or equal to 3.5° with respective of two planes perpendicular to the (100) plane, is the condition to be greater than or equal to approximately 5° (3.5×√2) in the case of inclination in <001> direction, for example.

It should be noted the surface orientation of the current silicon crystal is controlled with in a range of approximately ±0.5° and the surface orientation cannot be checked in advance of ion implantation, the range of ±0.5° should be accommodated in the angular range. As actual crystal orientation, it may be sufficient to be greater than or equal to 3.5° to form with two of (0$\bar{1}$1) plane and (011) plane. However, in order to obtain the crystal satisfying this condition, the crystal orientation has to be designated in the region to be greater than or equal to 4.0°. This condition corresponds to the condition to be greater than or equal to approximately 5.7° in the case where the surface is inclined in <001> direction, for example.

The present invention defines the angle to form with the <100> direction perpendicular to (100) plane to be less than or equal to 10°, under the following reason. Currently, fabrication of the semiconductor element is primarily performed for the substrate having surface orientation near (100) plane. If the orientation of the crystal surface is significantly deviated from the (100) plane, process condition can be differentiated to cause inconvenience.

For instance, when orientation of the substrate is significantly deviated, such deviation may influence for anisotropy of mobility, thickness of thermal oxide layer, configuration deformation in shaping process (particularly in wet etching), selective layer formation (such as selective epitaxial growth) which is expected to be used more frequently, and so forth. Therefore, despite of the expected merit for capability of uniform high energy ion implantation, demerit becomes much greater. In this sense, the angular range not to be influence by other low order plane is less than or equal to approximately 10°.

By limiting the surface orientation of the silicon substrate as defined in the appended claim, the conventional process condition can be maintained unchanged and uniformity in high energy ion implantation in perpendicular direction to the surface of the substrate can be maintained. As a result, the characteristics of the element to the formed on the semiconductor substrate of the present invention, by high energy ion implantation, can be maintained uniform.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DETAILED DESCRIPTION OF THE PREFERRED EMBODIMENTS

Next, the preferred embodiments of the semiconductor substrates and the semiconductor devices will be discussed with reference to FIGS. 3 to 11. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 3:
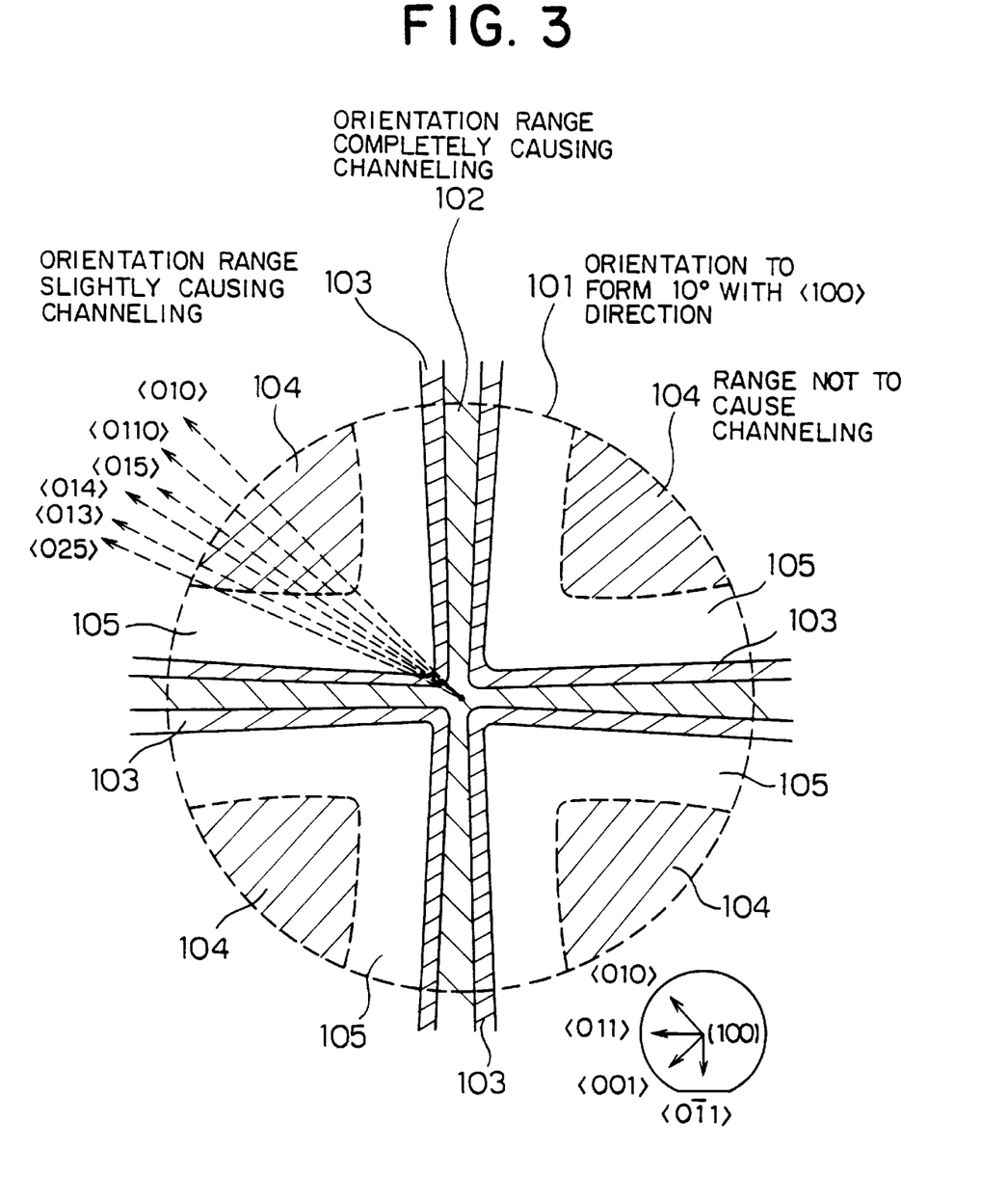
FIG. 3 is a plan view illustrating a surface orientation range in one embodiment of a semiconductor substrate according to the present invention.

FIG. 3 shows a plan view for illustrating a surface orientation region in one embodiment of a semiconductor substrate according to the present invention. It should be noted that FIG. 3 shows a distribution of crystal orientation of one embodiment of the semiconductor device. A center point corresponds to the <100> direction perpendicular to the (100) plane. An inclination angle is shown in the radial direction. A circle 101 shown by the dotted line represents an orientation forming an angle of 10° from the (100) plane. The correspondence of the surface orientation of the semiconductor substrate having the major surface at the (100) plane is shown in the right lower portion in FIG. 3.

It is assumed that ion implantation is performed for phosphorous when the surface orientation of the semiconductor substrate of silicon lies within the region 102, channeling is caused completely. While it depends on the implanted ion species and implantation energy, when the ion species is boron or when implantation is to be performed with higher energy, the region 102 tends to be narrowed.

Accordingly, as long as the substrate has an orientation out of the region 102, complete channeling will not be caused even in other ion implanting conditions.

The region 103 adjacent the region 102 shows the orientation range where channeling is caused slightly. This region is the crystal orientation region where the angle formed by the (010) plane and (001) plane is less than or equal to about 0.9°. Namely, when the surface orientation of the semiconductor device of silicon falls within the region 103, there should be a portion where the implanted ion reaches deeper position in the substrate in comparison with that in the portion where no channeling is caused, to cause non-uniformity of the implantation depth in the substrate, while the degree of non-uniformity is less than that of the region 102. For instance, in the case of the semiconductor substrate having surface orientation inclined in a direction of <0$\bar{1}$1> direction ±10°, channeling is inherently caused even at large off angle (inclination angle).

In the range of FIG. 3, when high energy ion implantation is performed in the perpendicular direction for the semiconductor substrate of silicon having the surface orientation out of the regions 102 and 103, no channeling will be caused. However, in order to avoid channeling with taking precision in setting of substrate in the ion implantation device (±1.0°) and wafer dependency of incident angle of ion (±1.6° in case of 8 inch substrate) into account, it is practically necessary to specify the surface orientation so as not to cause channeling. In consideration of this, by specifying the surface orientation in the region 104 in FIG. 3, channeling will never be caused even when ion implantation is performed with high energy in perpendicular direction to the substrate, and uniformity of the implanted layer can be maintained with respect to the 8 inch semiconductor substrate.

A region 105 defined between the regions 103 and 104 corresponds to the surface orientation of 2.6° (=1.6+1.0). The off angle corresponding to the surface orientations defined in the shown embodiment may be defined for six directions as follows:

| | |
|---|---|
| off angle in <010> direction | 5.0 to 10.0° |
| off angle in <0110> direction | 5.6 to 10.0° |
| off angle in <015> direction | 6.3 to 10.0° |
| off angle in <014> direction | 6.9 to 10.0° |
| off angle in <013> direction | 7.9 to 10.0° |
| off angle in <025> direction | 9.0 to 10.0° |

These ranges of off angles define the regions 104 in FIG. 3 in 6 directions shown by arrow in FIG. 3. In consideration of symmetrical relationship of the surface in the vicinity of the (100) plane, the <010> direction is equivalent to <001> direction, <0$\bar{1}$0> direction and the <00$\bar{1}$> direction are equivalent. Also, <0XY> direction (e.g. X=1 and Y=10) is equivalent to <0$\bar{X}$Y> direction, <0X$\bar{Y}$> direction, <0$\bar{X}\bar{Y}$> direction, <0YX> direction, <0$\bar{Y}$X> direction, <0Y$\bar{X}$> direction and <0$\bar{Y}\bar{X}$> direction.

Accordingly, with combining these and employing the semiconductor substrate of silicon having the orientation in the range within the region 104 is used as surface orientation, channeling will never be caused even when high energy ion implantation is performed in perpendicular direction to the substrate. The region 104 represents the range of the crystal orientation lies within a range forming an angle less than or equal to 10° with the direction <100> perpendicular to the plane of crystal orientation (100), and the angle formed with two of (0$\bar{1}$1) plane and (011) plane is in a range greater than or equal to 3.5°.

The foregoing condition is represents a value derived in the premise that the ion implantation device having substantially high performance (diffusion of beam and so forth). In the case where the beam is diffused widely, the substrate having higher crystal orientation has to be employed. When ion implanting device having a beam diffusion angle of ±2.4° is employed, an angle to be formed with the (110) type plane is required to be greater than or equal to 4.3°, and the off angle in the <010> direction, for example is required to be approximately 6°. As can be appreciated from comparison with the orientation range of the conventional substrate as illustrated in FIG. 2, by the shown embodiment, the region where no channeling problem will be arisen, is significantly expanded.

Figure 4A:
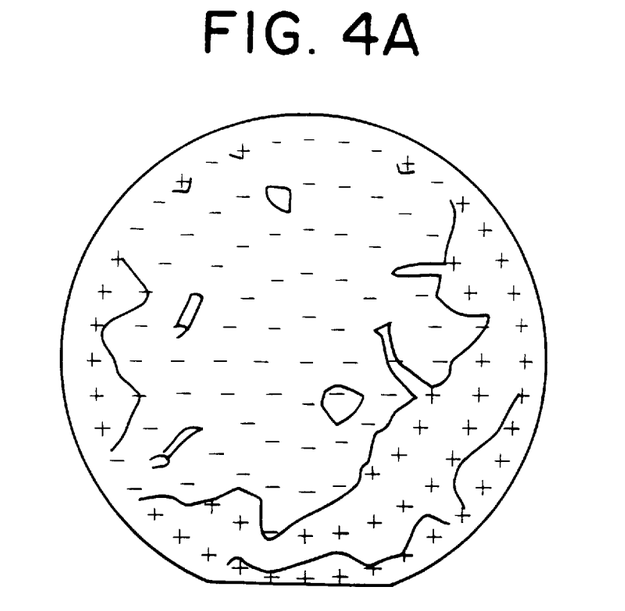
FIGS. 4A and 4B are illustration showing comparison of a layer resistance in the case where high energy ion implantation is performed for the first embodiment of the semiconductor substrate according to the invention and a layer resistance in the case where high energy ion implantation is performed for the conventional substrate.
Figure 4B:
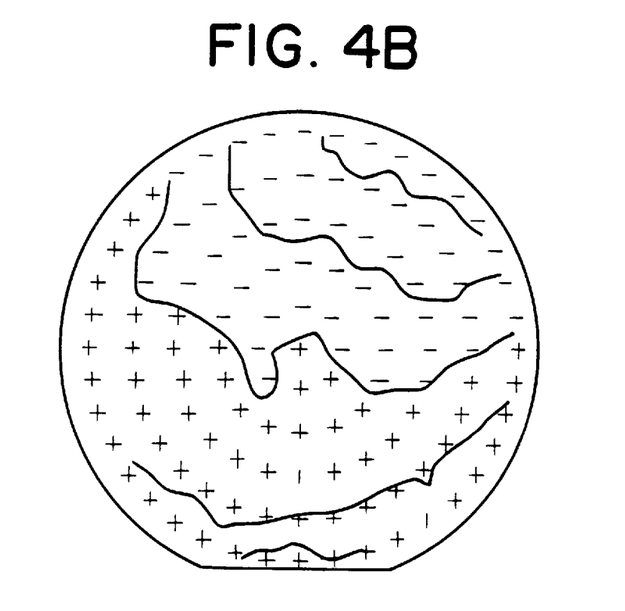

FIG. 4A shows a layer resistance distribution in the 8 inch substrate which is fabricated by ion implantation of $4 \times 10^{13}$ cm$^{-2}$ of phosphorous ion is performed at 300 keV for the first embodiment of the substrate having (100) plane inclined up to 5.4° in the <001> direction, and subsequently the implanted ion is activated by heat treatment at 950° C. for 30 minutes. FIG. 4B shows the result of the same ion implantation and heat treatment for the conventional substrate having (100) plane inclined up to 3.9° in the <001> direction. The off angle of the substrate is obtained, after measurement of the layer resistance, employing X-ray with regarding that the off angle is given in the <001> direction. Each line is drawn at every 1% of variation of the layer resistance.

In case of the layer resistance distribution of the substrate with off angle up to 5.4° as shown in FIG. 4A, the fluctuation of the layer resistance (standard deviation) is 0.6%. In contrast to this, in case of the layer resistance distribution of the substrate with off angle up to 3.9°, the fluctuation of the layer resistance (standard deviation) becomes 1.0%. Since the guaranteed value for non-uniformity of implantation of the ion implantation device is up to 0.5%, it can be said that influence of channeling is quite few in the case of FIG. 4A. On the other hand, in case of FIG. 4B, channeling clearly influences.

Figure 5:
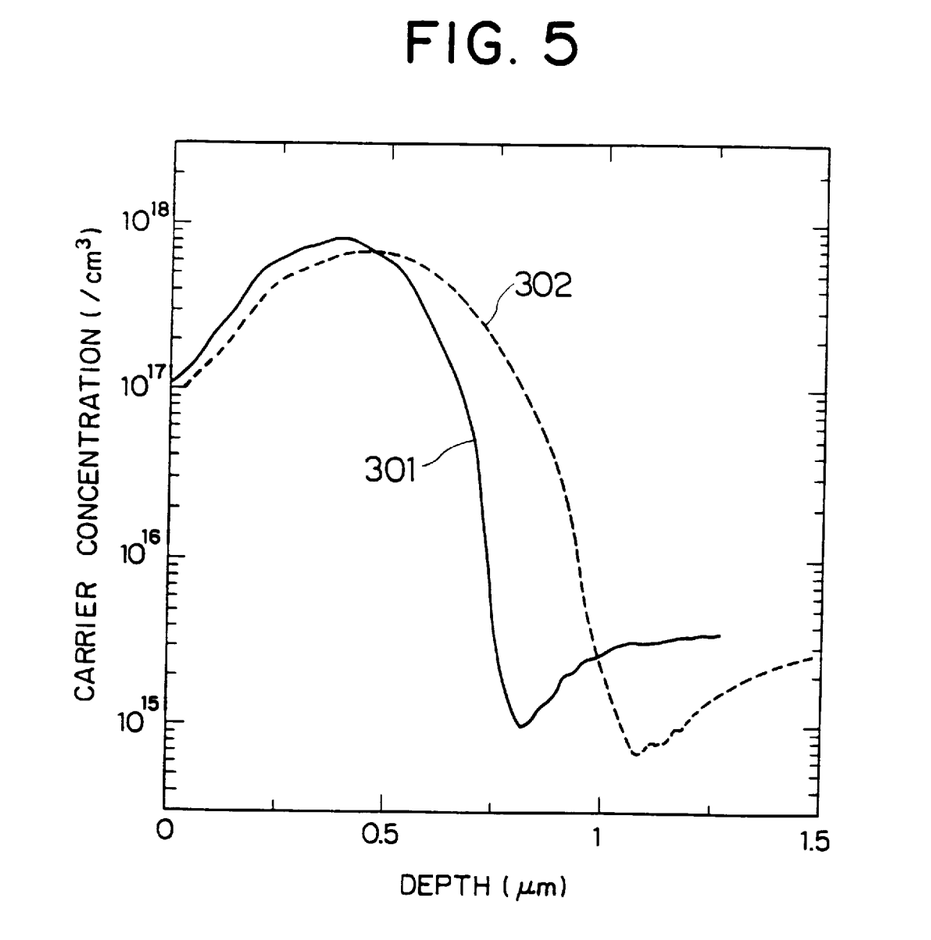
FIG. 5 is a graph showing carrier profile in the depth direction in the semiconductor substrate of FIG. 4B.

FIG. 5 shows a comparison of the carrier profile 301 in the depth direction in the portion not affected by the channeling and the carrier profile 302 in the depth direction for the portion significantly affected by channeling. Since the ion implantation amount is low, i.e. $4 \times 10^{13}$ cm$^{-2}$, activation is performed by heat treatment at 950° C. for 30 minutes, the carrier profile may be considered as the impurity profile. While the layer resistance is differentiated in the extent of 12 Ω□ and 396 Ω□, substantial difference can be seen in the profile in the depth direction from FIG. 5.

The difference of the layer resistance is caused due to the fact that the mobility at the carrier density of around $10^{17}$ cm$^{-3}$ is not proportional to the carrier concentration (even when the carrier concentration becomes double, the layer resistance cannot be lowered up to half). Therefore, the layer resistance is relatively insensitive to difference of the carrier profile. Accordingly, the channeling should give greater influence than the impression given from the difference of the layer resistance.

Figure 6A:
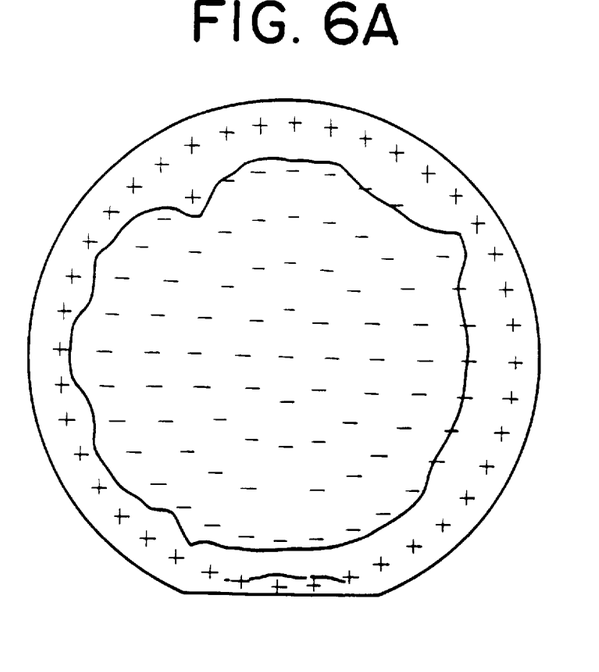
FIGS. 6A and 6B are illustration showing comparison of a layer resistance in the case where high energy ion implantation is performed for the second embodiment of the semiconductor substrate according to the invention and a layer resistance in the case where high energy ion implantation is performed for the conventional substrate.

FIG. 6A shows layer resistance in the 8 inch substrate which is fabricated by performing ion implantation of $4\times10^{13}$ cm$^{-2}$ of phosphorous at 400 keV and subsequently, the implanted ion is activated by heat treatment at 95020 C. for 30 minutes for the second embodiment of substrate having (100) plane included for 7° in the <015> direction. On the other hand, FIG. 6B shows the result of ion implantation and heat treatment in the same manner to be above for the conventional substrate having the (100) plane inclined for 7° in the direction of <011>.

Figure 6B:
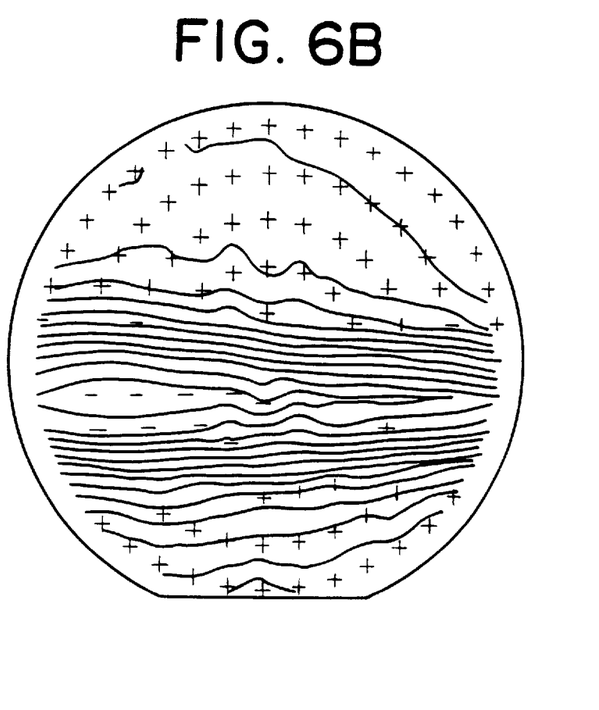

As shown in FIGS. 6A and 6B, despite of the fact that the surface orientation is inclined for 7° from the (100) surface, the distribution of the layer resistance in the substrate is significantly differentiated as shown in FIGS. 6A and 6B. Namely while the layer resistance in the case of substrate of FIG. 6A is 0.5%, the uniformity of the layer resistance is merely 3.9%. In FIG. 6B, while the layer resistance is varied significantly in one direction, this is the characteristics of the ion implanting device. From the layer resistance distribution shown in FIG. 6B, it should be clear that complete channeling is caused in the case of the substrate of FIG. 6B.

Figure 7:
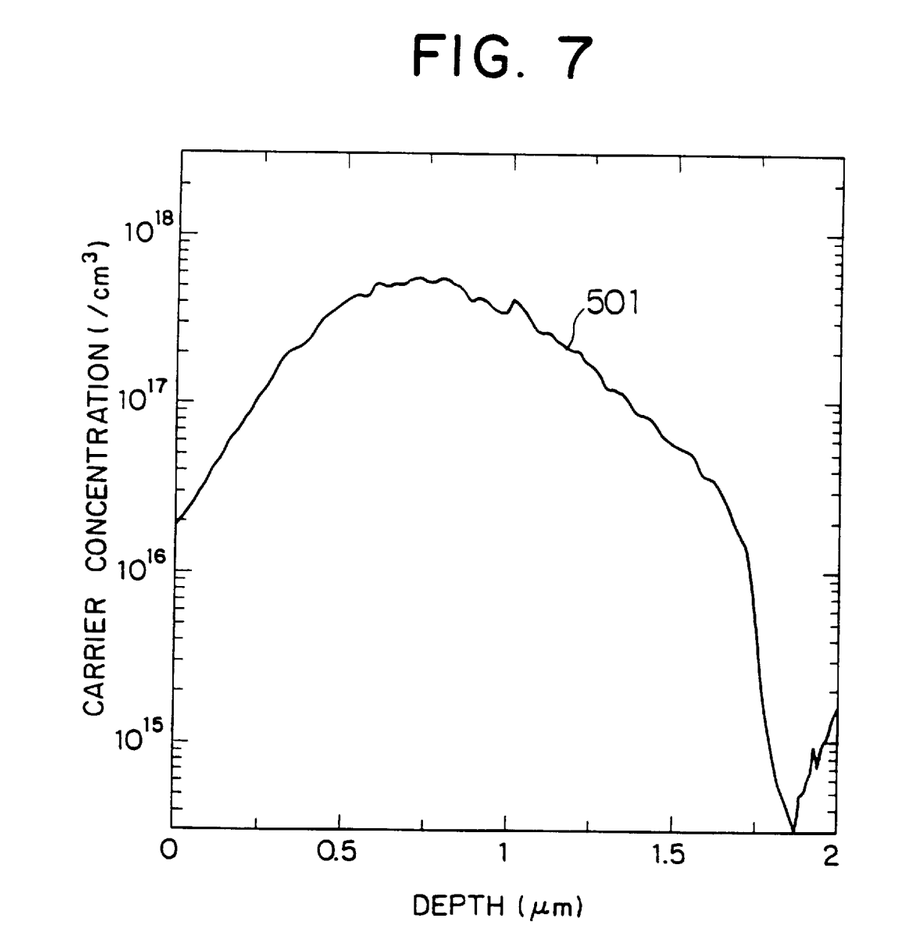
FIG. 7 is a graph showing the carrier profile in the depth direction of the portion where most significant channeling is caused in the semiconductor substrate of FIG. 6B.

In the substrate of FIG. 6B, the carrier profile in the depth direction at the center portion where most significant channeling is caused as shown by 501 in FIG. 7. The carrier profile 501 has deeper peak for greater than or equal to 2.50 μm that the peak depth up to 0.5 μm in the case where no channeling is caused. Therefore, effective of the shown embodiment can be clearly understood.

Figure 8:
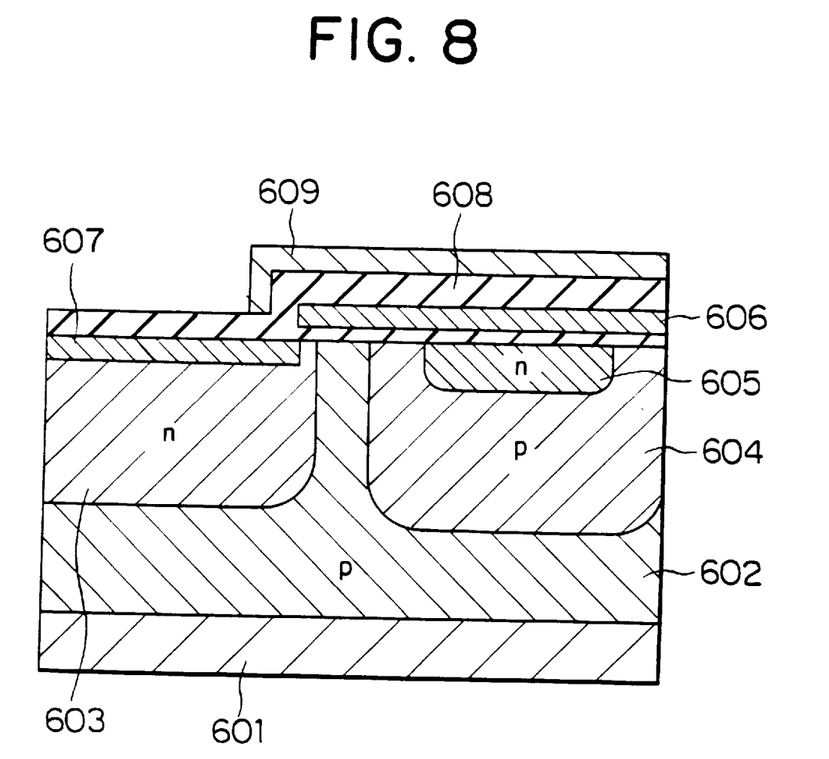
FIG. 8 is a section showing a structure of the first embodiment of the semiconductor device according to the invention.

FIG. 8 shows a sectional structure of the first embodiment of a semiconductor device. The shown embodiment is directed to a semiconductor device, in which a pixel portion of a solid-state image pick-up element is formed by high energy ion implantation on the semiconductor substrate of the present invention. The pixel portion of the solid-state image pick-up element in the show embodiment is fabricated by forming a p-type well layer 602 on the n-type substrate 601 by high energy ion implantation and, within the p-type well layer, a n-type sensor portion 603 is formed by high energy ion implantation.

Adjacent the n-type sensor portion 603, a charge transfer portion constituted of a p-type later 604, a n-type layer 605 and a gate oxide layer 606 is formed on the p-type well layer 502. Also, on the n-type sensor portion 603, p$^+$layer 607 is formed. 608 denotes a silicon dioxide layer, and 609 denotes a light insulation layer. In this pixel portion, a charge generated by a light beam penetrating into the n-type sensor portion 603 is sequentially transferred by adjacent charge transfer portion. The sensitivity of the pixel portion becomes higher at thicker n-type sensor portion.

The reason why the high energy ion implantation is employed for fabricating such pixel portion of the solid-state image pick-up element of the structure as set forth above, is that it is desired to form firm junction between the p-type well layer 602 and the n-type sensor portion 603, that it is desired to form the n-type sensor portion with sufficient thickness for attaining satisfactory sensitivity, that it is desired to narrow the interval with adjacent charge transfer portion for attaining higher package density, and so forth.

In order to form the p-type well layer by high energy ion implantation, heat treatment at relatively high temperature for long period is performed after ion implantation. By this, influence of the channeling can be reduced. However, the impurity concentration may be fluctuated depending upon noticeable channeling being caused or not. In contrast to this, since heat treatment after ion implantation of the n-type sensor portion is relatively short period, channeling may affect significantly.

The thickness of the n-type sensor portion 603 is determined by the impurity concentration in the p-type well layer 602 and a depth of ion implantation upon formation of the n-type sensor portion 603. For instance, when channeling is caused in formation of the n-type sensor portion 603, the n-type layer becomes thicker depending upon degree of channeling and as a result, sensitivity becomes high. The fluctuation of sensitivity due to occurrence of channeling may be caused not only between chips but within the chip in the significant case. Since the human vision is quite sensitive, when fluctuation of sensitivity within the chip is reflected on the display image, it is possible that a pattern is seen on the background of the image.

Figure 9A:
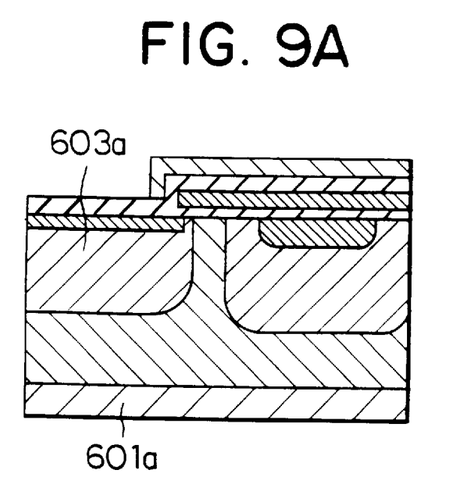
FIGS. 9A–9D is an illustration showing a comparison of the first embodiment of the semiconductor device according to the invention and the conventional semiconductor device.
Figure 9B:
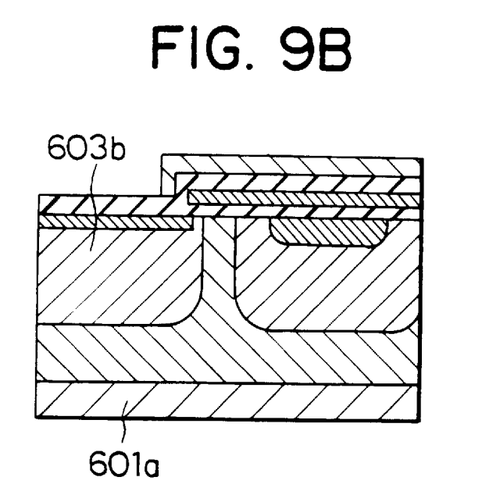
Figure 9C:
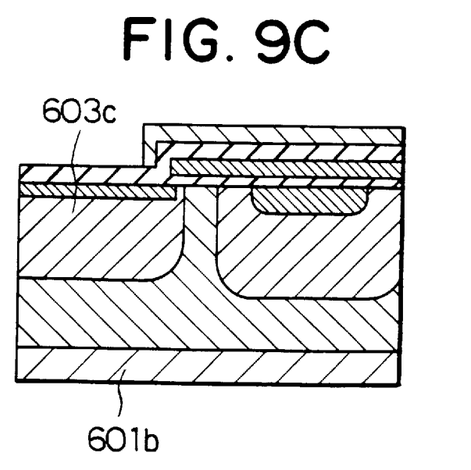
Figure 9D:
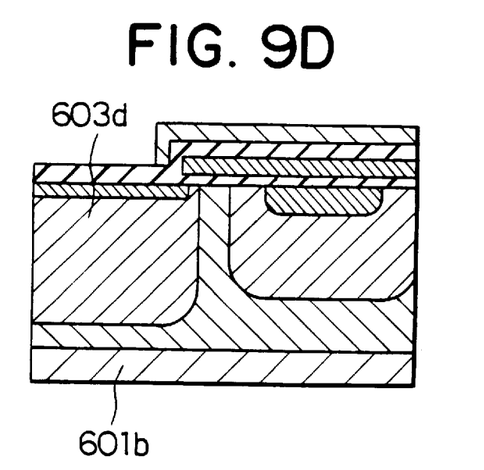

FIGS. 9A to 9D are sections showing comparison between the first embodiment of the semiconductor device according to the invention and the conventional device. FIGS. 9A and 9B show fluctuation in the first embodiment of the pixel portion in the solid-state image pick-up element formed by ion implantation in the perpendicular direction to the semiconductor substrate according to the present invention, and FIGS. 9C and 9D show fluctuation in the pixel portion of the solid-state image pick-up element formed by ion implantation in vertical direction to the conventional semiconductor substrate.

FIGS. 9A and 9B shows the first embodiment of the pixel portion of the solid-state image pick-up element which is formed with employing the n-type semiconductor substrate 601a having the surface inclined for an angle up to 5.5° from the (100) plane in the <001> direction. In this case, the n-type sensor portions 603a and 603b formed by high energy ion implantation in the perpendicular direction to the substrate 601a have few fluctuation of thickness. As a result, the fluctuation of sensitivity is up to 2%.

In contrast to this, in the pixel portion of the solid-state image pick-up element formed in the similar manner employing the conventional semiconductor substrate 601b having major surface at (100) plane, for example, the fluctuation of thickness in the n-type sensor portions 603c and 603d becomes substantial as seen in FIG. 9C and 9D. As a result, the fluctuation of sensitivity becomes large to be up to 10%. Also, when the semiconductor substrate having surface inclined from the (100) plane up to 4° in the <001> direction is employed, the fluctuation of sensitivity is still large to be up to 4%.

Figure 10:
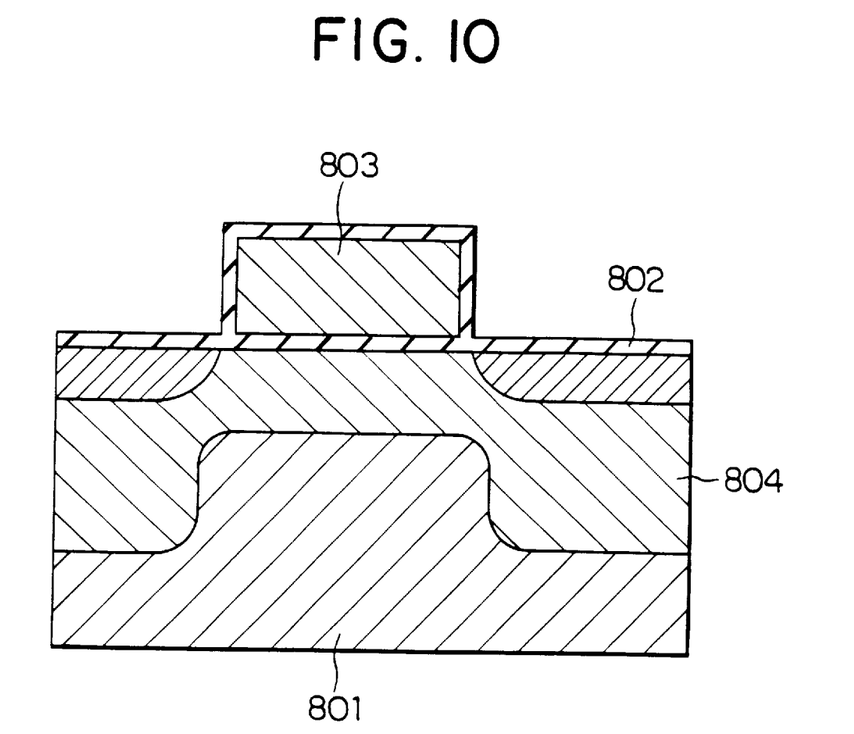
FIG. 10 is a section showing the second embodiment of the semiconductor device according to the invention.

FIG. 10 shows a sectional structure of the second embodiment of a semiconductor device according to the present invention. In the shown embodiment, a well of a metal oxide semiconductor (MOS) transistor is formed by high energy upon implantation to the semiconductor substrate according to the present invention. While formation of the well of the MOS transistor may performed independently, it is frequently performed in the process of simultaneously forming a channel stopper (oxide layer at element isolating portion/ boron implantation into a silicon interface) in n-type MOS or a punch through stopper layer for restricting short channel effect.

FIG. 10 shows the structure fabricated through the latter process. After forming a silicon dioxide layer 802 (serving also as gate oxide layer) and a gate electrode 803 on the semiconductor substrate of silicon (silicon substrate) 801, boron is implanted in such a manner that the implantation depth is deep in the region beneath region to be source or drain and shallow in the region beneath the gate electrode or the end.

In such construction, the implantation depth to the silicon substrate 801 under the gate electrode may become uniform for the presence of upper layer, such as the gate electrode 803 and so forth. On the other hand, in the region where no gate electrode is present and depth of ion implantation is relatively deep, it is possible to cause channeling.

For the tendency of narrowing of isolation width between the p-type well and the n-type well and oblique ion implantation is not possible in the condition where the gate electrode 803 is present. One of the reasons why the high energy ion implantation is performed for such structure, in that it is desired to reduce parasitic capacity to be caused by contacting of the source/drain layer and a high concentration well region. Accordingly, it is typical that the implantation to the region beneath the region to be the source or drain, the ion implantation depth becomes much deeper than the depth of the source/drain layer.

Upon performing high energy ion implantation for forming such region, unexpectedly low concentration well layer can be formed beneath the source/drain layer. As a result, while the parasitic capacity becomes small, void layer becomes thicker to increase a leak current. By employing the semiconductor substrate for formation of the structure as shown in FIG. 10, in comparison with the case where the MOS transistor is formed through the similar process employing the conventional semiconductor substrate, uniformity of parasitic capacity is improved and local increasing of the leak current can be suppressed.

Figure 11A:
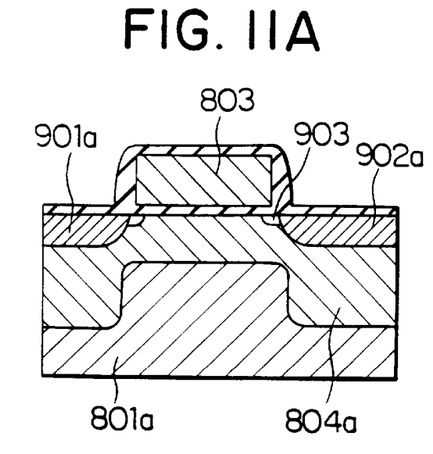
FIGS. 11A to 11D are illustration showing comparison between the second embodiment of the semiconductor device according to the invention and the conventional semiconductor substrate.
Figure 11B:
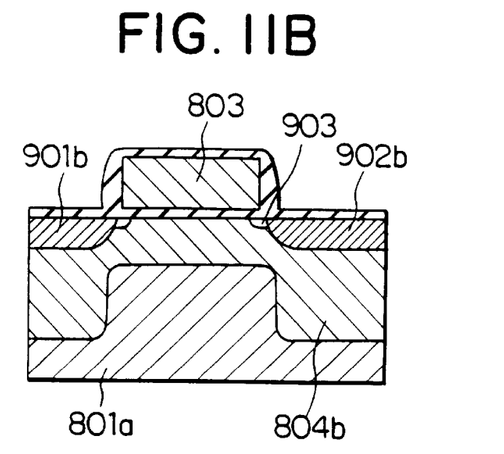
Figure 11C:
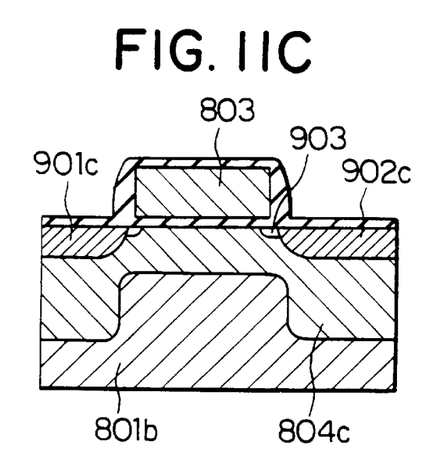
Figure 11D:
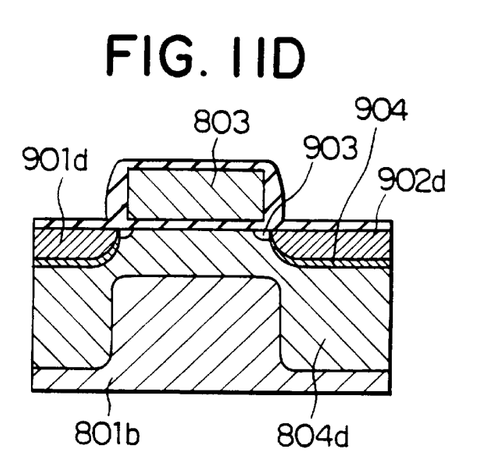

FIGS. 11A to 11D are sections showing comparison of the second embodiment of the semiconductor device according to the invention and the conventional device. FIGS. 11A to 11D are diagrammatically illustrates influence of the channeling for the structure of the n-type MOS transistor. FIGS. 11A and 11B show fluctuation of structure of the n-type MOS transistor as the second embodiment of the semiconductor device according to the invention which is formed by high energy ion implantation in vertical direction to the semiconductor substrate according to the invention, and FIGS. 11C and 11D show fluctuation of structure of the n-type MOS transistor formed by high energy ion implantation in vertical direction to the conventional semiconductor substrate.

As shown in FIGS. 11A and 11B, on the semiconductor substrate according to the present invention, boron implantation layers 804a and 804b are formed by high energy ion implantation, and subsequently, source layers 901a, 901b and drain layers 902a, 902b are formed. It should be noted that 903 denotes n layer. As can be seen, in the shown embodiment, the depth of the boron implantation layers 804a and 804b are substantially equal to each other and thus uniformity can be maintained.

In contrast, in the case where, as shown in FIGS. 11C and 11D, on the conventional semiconductor substrate, boron implantation layers 804c and 804d are formed by high energy ion implantation, and subsequently, the source layers 901c, 901d and the drain layers 902c, 902d are formed, the depth of the boron implantation layer 804c and 804d becomes non-uniform. Also, as shown in FIG. 11D, it is possible that low concentration p⁻ layer 904 can be formed beneath the source layer 901d and the drain layer 902d to be a cause of leak current. In contrast to this, in the shown embodiment, even in the same process, the low concentration layer will never be formed. While formation of the structure shown in FIG. 9D may be avoided by adding low energy ion implantation, it may not be effective for improving uniformity and addition of low energy ion implantation inherently cause increasing of the process step.

It should be noted that while the effectiveness of the present invention has been discussed primarily in terms of the high energy ion implantation, it should be clearly effective for suppressing channeling even in the low energy ion implantation. Considering only possibility of causing channeling, a critical angle of channeling, i.e. angular range to cause channeling, in the low energy ion implantation is greater. Even though there are factors to be improved in the process for suppressing channeling, it is naturally desirable to have the semiconductor substrate to have lower possibility to cause channeling.

As set forth above, with the semiconductor substrate according to the present invention, since the range of one major plane of the semiconductor substrate of silicon is limited in consideration of precision of high ion implantation device and silicon crystal structure, the semiconductor substrate which will never cause channeling even when ion implantation is performed in perpendicular direction to the major surface, can be obtained.

Also, with the semiconductor device according to the present invention, since heat treatment process is eliminated and high performance may be obtained by implantation profile formed by ion implantation. Therefore, in the high energy ion implantation, for which demand for uniformity is stronger in comparison with conventional low energy ion implantation, the semiconductor substrate according to the present invention is employed to obtain high quality and high density element through high energy ion implantation in perpendicular direction to the major surface of the substrate.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A semiconductor substrate having a surface substantially resistive to channeling when a high energy ion implantation greater than 300 keV is applied thereto, the semiconductor substrate comprising: one major surface of the semiconductor substrate at a plane forming an angle less than or equal to 10° with <100> direction perpendicular to (100) plane and forming angles greater than or equal to 3.5° with respective to (0$\bar{1}$1) plane and (011) plane perpendicular to said (100) plane, and said one major surface substantially resistant to channeling by the application thereto of the high energy ion implantation.

2. A semiconductor device fabricated from a semiconductor substrate of claim 1, wherein said high energy ion implantation is performed in a direction perpendicular to a surface of the semiconductor substrate.

3. A semiconductor substrate having a surface substantially resistive to channeling when a high energy ion implantation greater than 300 keV is applied thereto, the semiconductor substrate comprising:

one major surface of the semiconductor substrate at a plane forming an angle greater than or equal to 5° and smaller than or equal to 10° with (100) plane, an inclined orientation of said major surface forming an angle greater than or equal to 3.5° with <0$\overline{1}$0> direction and forming an angle greater than or equal to 3.5° with <011> direction.

4. A semiconductor substrate having a surface substantially resistive to channeling when a high energy ion implantation greater than 300 keV is applied thereto, the semiconductor substrate comprising:

one major surface of the semiconductor substrate at a plane forming an angle greater than or equal to 5° and smaller than or equal to 10° with (010) plane, an inclined orientation of said major surface forming an angle greater than or equal to 3.5° with <$\overline{1}$01> direction and forming an angle greater than or equal to 3.5 with <101> direction.

5. A semiconductor substrate having a surface substantially resistive to channeling when a high energy ion implantation greater than 300 keV is applied thereto, the semiconductor substrate comprising:

one major surface of the semiconductor substrate at a plane forming an angle greater than or equal to 5° and smaller than or equal to 10° with (001), an inclined orientation of said major surface forming an angle greater than or equal to 3.5° with <$\overline{1}$10> direction and forming an angle greater than or equal to 3.5° with (<110> direction.

6. A semiconductor substrate having a surface substantially resistive to channeling when a high energy ion implantation greater than 300 keV is applied thereto, the semiconductor substrate comprising:

one major surface of the semiconductor substrate at a plane forming an angle less than or equal to 10° with (100), an inclination orientation of said major surface forming an angle greater than or equal to 5° in the vicinity of <010>, <0$\overline{1}$0>, <001> or <00$\overline{1}$>, an inclination orientation of said major surface forming an angle greater than or equal to 5.6° in the vicinity of <0$\overline{1}$10>, <01$\overline{1}$0>, <0110>, <0$\overline{1}\overline{1}$0>, <0$\overline{1}$0>, <010$\overline{1}$>, <0101> or <0$\overline{1}$0$\overline{1}$>, an inclination orientation of said major surface forming an angle greater than or equal to 6.3° in the vicinity of <0$\overline{1}$5>, <01$\overline{5}$>, <015>, <0$\overline{1}\overline{5}$>, <0$\overline{5}$1>, <05$\overline{1}$>, <051>, or <0$\overline{5}\overline{1}$>, an inclination orientation of said major surface forming an angle greater than or equal to 6.9° in the vicinity of <0$\overline{1}$4>, <01$\overline{4}$>, <014>, <0$\overline{1}\overline{4}$>, <0$\overline{4}$1>, <04$\overline{1}$>, <041>, or <0$\overline{4}\overline{1}$>, an inclination orientation of said major surface forming an angle greater than or equal to 7.9° in the vicinity of <0$\overline{1}$3>, <01$\overline{3}$>, <013>, <0$\overline{1}\overline{3}$>, <0$\overline{3}$1>, <03$\overline{1}$>, <031> or <0$\overline{3}\overline{1}$>, an inclination orientation of said major surface forming an angle greater than or equal to 9.0° in the vicinity of <0$\overline{2}$5>, <02$\overline{5}$>, <025>, <0$\overline{2}\overline{5}$>, <0$\overline{5}$2>, <05$\overline{2}$><052> or <0$\overline{5}\overline{2}$>.

7. A semiconductor substrate having a surface substantially resistive to channeling when a high energy ion implantation greater than 300 keV is applied thereto, the semiconductor substrate comprising:

one major surface of the semiconductor substrate at a plane forming an angle less than or equal to 10° with (010), an inclination orientation of said major surface forming an angle greater than or equal to 5° in the vicinity of <100>, <$\overline{1}$>, <00$\overline{1}$> or <001>, an inclination orientation of said major surface forming an angle greater than or equal to 5.6° in the vicinity of <$\overline{1}$010>, <1 0$\overline{1}$0>, <1010>, <$\overline{1}$0$\overline{1}$0>, <$\overline{1}$001>, <100$\overline{1}$>, <1001> or <$\overline{1}$00$\overline{1}$>, an inclination orientation of said major surface forming an angle greater than or equal to 6.3° in the vicinity of <$\overline{1}$05>, <10$\overline{5}$>, <105>, <$\overline{1}$0$\overline{5}$>, <$\overline{5}$01>, <50$\overline{1}$>, <501> or <$\overline{5}$0$\overline{1}$>, an inclination orientation of said major surface forming an angle greater than or equal to 6.9° in the vicinity of <$\overline{1}$04>, <10$\overline{4}$>, <104>, <$\overline{1}$0$\overline{4}$>, <$\overline{4}$01>, <40$\overline{1}$>, <401> or <$\overline{4}$0$\overline{1}$>, an inclination orientation of said major surface forming an angle greater than or equal to 7.9° in the vicinity of <$\overline{1}$03>, <10$\overline{3}$>, <103>, <$\overline{1}$0$\overline{3}$>, <$\overline{3}$01>, <30$\overline{1}$>, <301> or <$\overline{3}$0$\overline{1}$>, an inclination orientation of said major surface forming an angle greater than or equal to 9.0° in the vicinity of <$\overline{2}$05>, <20$\overline{5}$>, <205>, <$\overline{2}$0$\overline{5}$>, <$\overline{5}$02>, <50$\overline{2}$>, <502> or <$\overline{5}$0$\overline{2}$>.

8. A semiconductor substrate having a surface substantially resistive to channeling when a high energy ion implantation greater than 300 keV is applied thereto, the semiconductor substrate comprising:

one major surface of the semiconductor substrate at a plane forming an angle less than or equal to 10° with (001), an inclination orientation of said major surface forming an angle greater than or equal to 5° in the vicinity of <$\overline{1}$00>, <100>, <0$\overline{1}$0> or <010>, an inclination orientation of said major surface forming an angle greater than or equal to 5.6° in the vicinity of <$\overline{1}$100>, <1$\overline{1}$00>, <1100>, <$\overline{1}\overline{1}$00>, <$\overline{1}$01 0>, <10$\overline{1}$0>, <101 0> or <$\overline{1}$0$\overline{1}$0>, an inclination orientation of said major surface forming an angle greater than or equal to 6.3° in the vicinity of <$\overline{1}$50>, <1$\overline{5}$0>, <150>, <$\overline{1}\overline{5}$0>, $\overline{5}$10>, <5$\overline{1}$ 0>, <$\overline{1}$010>, <10 $\overline{1}$0>, <1010> or <$\overline{1}$0$\overline{1}$0, an inclination orientation of said major surface forming an angle greater than or equal to 6.9° in the vicinity of <$\overline{1}$04>, <1 0$\overline{4}$>, <104>, <$\overline{1}$0$\overline{4}$>, <$\overline{4}$01>, <4 0$\overline{1}$>, <401> or <$\overline{4}$0$\overline{1}$>, an inclination orientation of said major surface forming an angle greater than or equal to 7.9° in the vicinity of <$\overline{1}$30>, <1$\overline{3}$0>, <130>, <$\overline{1}\overline{3}$0>, <$\overline{3}$1 0>, <3$\overline{1}$0>, <310> or <$\overline{3}\overline{1}$0>, an inclination orientation of said major surface forming an angle greater than or equal to 9.0° in the vicinity of <$\overline{2}$05, <20$\overline{5}$>, <205>, <$\overline{2}$0$\overline{5}$>, <$\overline{5}$02>, <50$\overline{2}$>, <502> or <$\overline{5}$0$\overline{2}$>.

* * * * *